(12) United States Patent
Aliane

(10) Patent No.: US 9,165,915 B2
(45) Date of Patent: Oct. 20, 2015

(54) FLIP-CHIP HYBRIDIZATION OF MICROELECTRONIC COMPONENTS USING SUSPENDED FUSIBLE RESISTIVE CONNECTION ELEMENTS

(71) Applicant: Commissariat A L'Energie Atomique Et Aux Energies Alternatives, Paris (FR)

(72) Inventor: Abdelkader Aliane, Grenoble (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 57 days.

(21) Appl. No.: 14/203,628

(22) Filed: Mar. 11, 2014

(65) Prior Publication Data
US 2014/0220737 A1 Aug. 7, 2014

Related U.S. Application Data

(63) Continuation of application No. PCT/FR2012/051995, filed on Sep. 6, 2012.

(30) Foreign Application Priority Data

Oct. 13, 2011 (FR) ...................................... 11 59239

(51) Int. Cl.
*H01L 23/48* (2006.01)
*H01L 25/00* (2006.01)
*H01L 23/13* (2006.01)
(Continued)

(52) U.S. Cl.
CPC ................ *H01L 25/50* (2013.01); *H01L 23/13* (2013.01); *H01L 23/49811* (2013.01); *H01L 24/16* (2013.01); *H01L 24/81* (2013.01); *H01L 23/49838* (2013.01); *H01L 24/13* (2013.01); *H01L 2224/0401* (2013.01); *H01L 2224/05011* (2013.01); *H01L 2224/05026* (2013.01); *H01L 2224/131* (2013.01); *H01L 2224/16111* (2013.01); *H01L 2224/16237* (2013.01);
(Continued)

(58) Field of Classification Search
None
See application file for complete search history.

(56) References Cited

U.S. PATENT DOCUMENTS 5,700,987 A 12/1997 Basavanhally
5,951,893 A 9/1999 Bitko et al.

FOREIGN PATENT DOCUMENTS

EP 1 193 750 A2 4/2002

OTHER PUBLICATIONS

International Search Report dated Nov. 7, 2012.

*Primary Examiner* — Zandra Smith
*Assistant Examiner* — Molly Reida
(74) *Attorney, Agent, or Firm* — Burr & Brown, PLLC

(57) ABSTRACT

A method of forming a hybridized device comprising forming a first microelectronic component provided, on a surface, with metal balls, and a second microelectronic component provided, on a surface, with connection elements corresponding to said metal balls, and hybridizing the first and second components to attach the metal balls of the first component to the connection elements of the second component. The manufacturing of the second microelectronic component comprises forming a substrate provided with cavities at the locations provided for the connection elements, and forming resistive elements made of fusible metal respectively suspended above the cavities. The hybridizing of the first and second components comprises transferring the first component onto the second component to have the metal balls rest on the suspended resistive elements, and circulating an electric current through the resistive elements to melt said elements.

10 Claims, 3 Drawing Sheets

(51) Int. Cl.
*H01L 23/498* (2006.01)
*H01L 23/00* (2006.01)
(52) U.S. Cl.
CPC ................ *H01L2224/81191* (2013.01); *H01L 2224/81234* (2013.01); *H01L 2224/81238* (2013.01); *H01L 2224/81385* (2013.01); *H01L 2224/81395* (2013.01); *H01L 2224/81409* (2013.01); *H01L 2224/81411* (2013.01); *H01L 2224/81815* (2013.01)

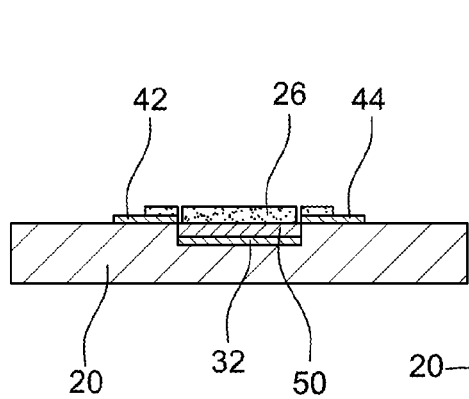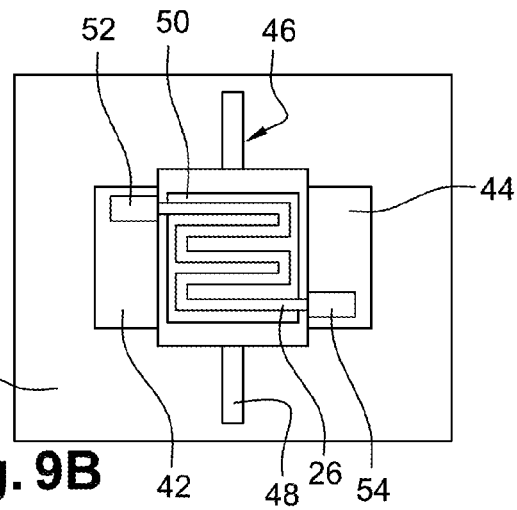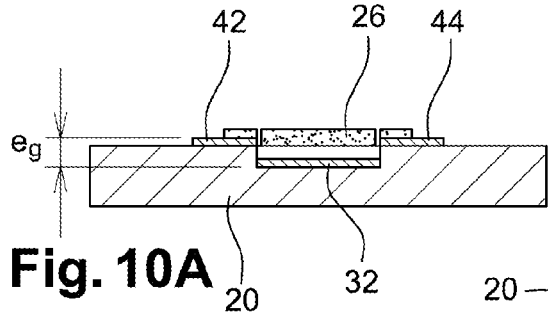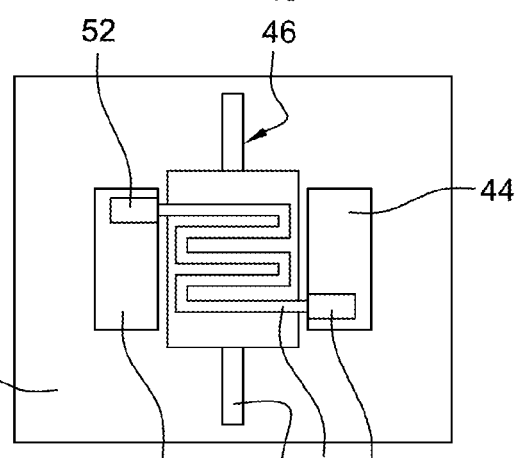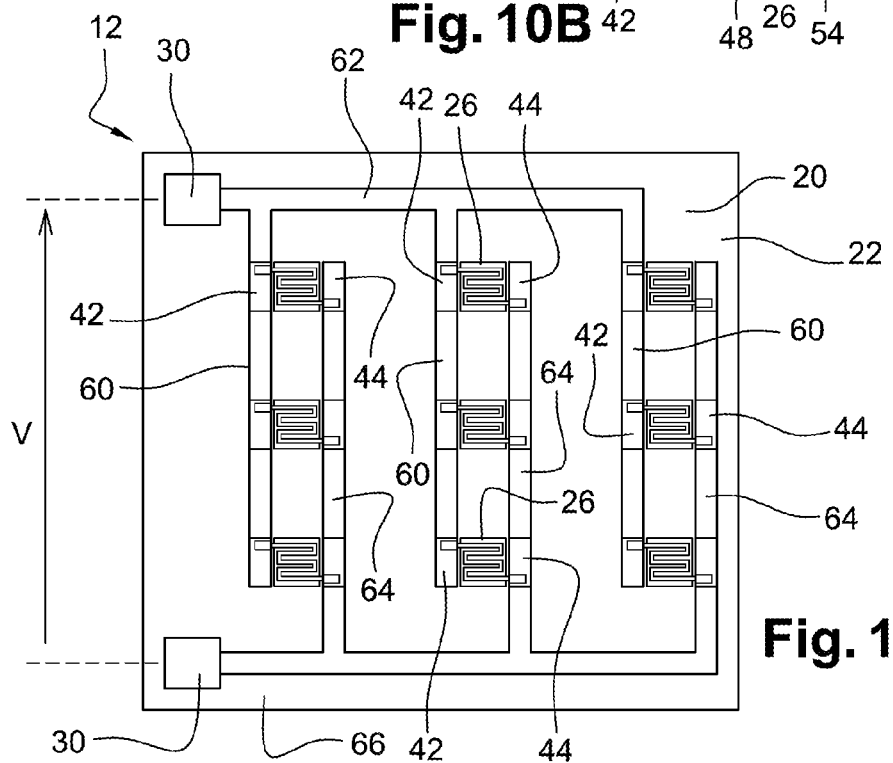

FLIP-CHIP HYBRIDIZATION OF MICROELECTRONIC COMPONENTS USING SUSPENDED FUSIBLE RESISTIVE CONNECTION ELEMENTS

FIELD OF THE INVENTION

The invention relates to the assembly of microelectronic components, and more particularly to "flip-chip" hybridization.

BACKGROUND

An assembly by the so-called "flip-chip" technique usually comprises forming electrically-conductive balls on a surface of a first electronic component and forming electrically-conductive connection elements, particularly balls or connection areas, on a surface of a second component according to a predetermined connection pattern. The first component is then transferred on the second component with the balls in front of corresponding connection elements, after which the assembly is pressed and heated. The balls then deform and melt to form electric connections perpendicular to the main plane of the electronic component, generally in the form of a wafer.

The most conventional technique to form the assembly is to perform a general heating of the assembly, for example, by placing the two components under a temperature-controlled atmosphere.

However, the melting of a metal ball requires high temperatures, higher than 170° C. Now, such temperatures are not compatible with organic components, particularly components made of plastic such as PEN (polyethylene naphthalate) and PET (polyethylene terephthalate), which have lower glass transition temperatures, of 120° C. for PEN and 70° C. for PET, for example. Thus, when a plastic component is submitted to the melting temperature of the solder balls, the plastic component takes a rubbery state and strongly deforms, or even destroys.

BRIEF DESCRIPTION OF THE INVENTION

The aim of the present invention is to provide a method providing a hybridization which implements a local heating of the metal balls while thermally insulating in an efficient way the component provided with the connection elements. For this purpose, the invention aims at a method of forming a hybrid device comprising forming a first microelectronic component provided, on a surface, with metal balls, and a second microelectronic component provided, on a surface, with connection elements corresponding to said metal balls, and hybridizing the first and second components to attach the metal balls of the first component to the connection elements of the second component.

According to the invention:
the manufacturing of the second microelectronic component comprises:
  forming a substrate provided with cavities at the locations provided for the connection elements; and
  forming resistive elements made of fusible metal respectively suspended above the cavities;
and the hybridization of the first and second components comprises:
  transferring the first component onto the second component to have the metal balls rest on the suspended resistive elements; and
  applying an electric current through resistive elements to melt said elements.

In other words, the substrate is isolated from the molten element by air until the molten metal flows into the cavity. Further, the melting of the resistive elements causes the settling of the first component under its own weight. The metal balls are thus introduced into the cavities in contact with the molten metal and bond to the substrate once the metal has cooled down.

According to an embodiment, the resistive elements are made in the form of coils or rods. Particularly, the resistive elements are made of a metal of low melting point, for example, indium or a gold and tin alloy. The resistive elements thus have a strong electric resistance. It is thus possible to obtain a strong heating with a low current and/or within a very short time.

According to an embodiment, the substrate of the second microelectronic component comprises plastic, particularly PEN or PET. For example, the substrate is a flexible substrate.

According to an embodiment, the suspended resistive elements are obtained as follows:
  deposition of two metal areas around each cavity;
  filling of the cavities with resin;
  forming of the resistive elements on the resin and on the metal areas, while leaving at least one passage of access to the resin; and
  removal of the resin from the cavities through the at least one access passage.

Particularly, the metal connection areas have a surface area greater than or equal to twice the surface area of the cavity.

According to an embodiment, the method comprises, before the forming of the suspended resistive elements, depositing a metal layer at the bottom of each cavity and at least one electric connection in contact with said layer. A mechanical and electrical interconnection of the first and second components is thus obtained.

According to an embodiment, the height of the cavities is greater than or equal to ⅛ of the ball height.

BRIEF DESCRIPTION OF THE DRAWINGS

The invention will be better understood on reading of the following description provided as an example only in relation with the accompanying drawings, where the same reference numerals designate the same or similar elements, among which:

FIGS. 4-6, 7A, 7B, 8A, 8B, 9A, 9B, 10A and 10B are simplified views illustrating a method of manufacturing a second component according to the invention provided with fusible resistive elements suspended above cavities; and FIG. 11 is a simplified top view of a second component illustrating a diagram of electric connection of the fusible resistive elements.

DETAILED DESCRIPTION OF THE INVENTION

Figure 1:
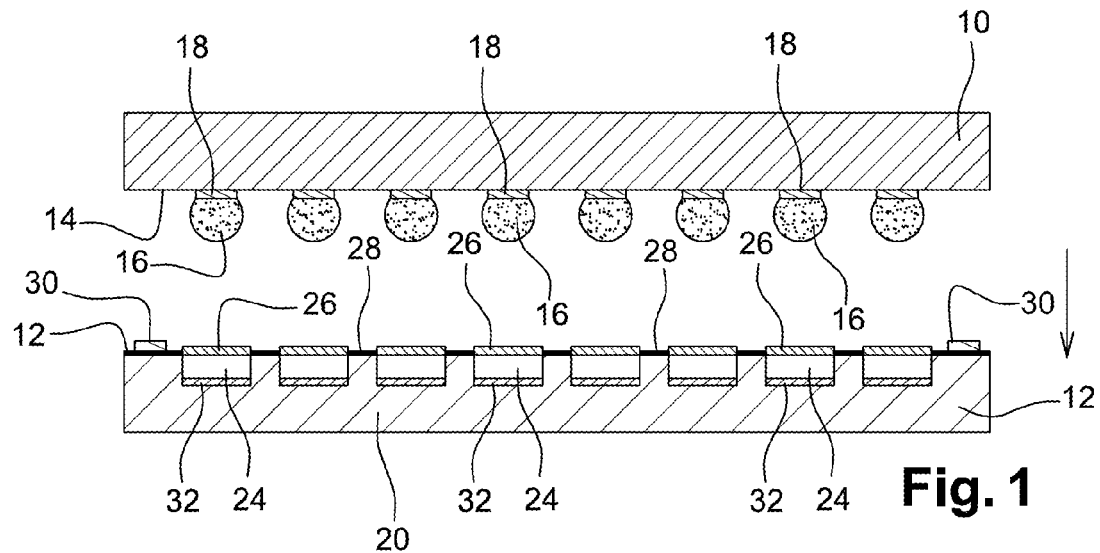
FIGS. 1 to 3 are simplified cross-section views illustrating a method of hybridizing a first and a second microelectronic components according to the invention.
Figure 2:
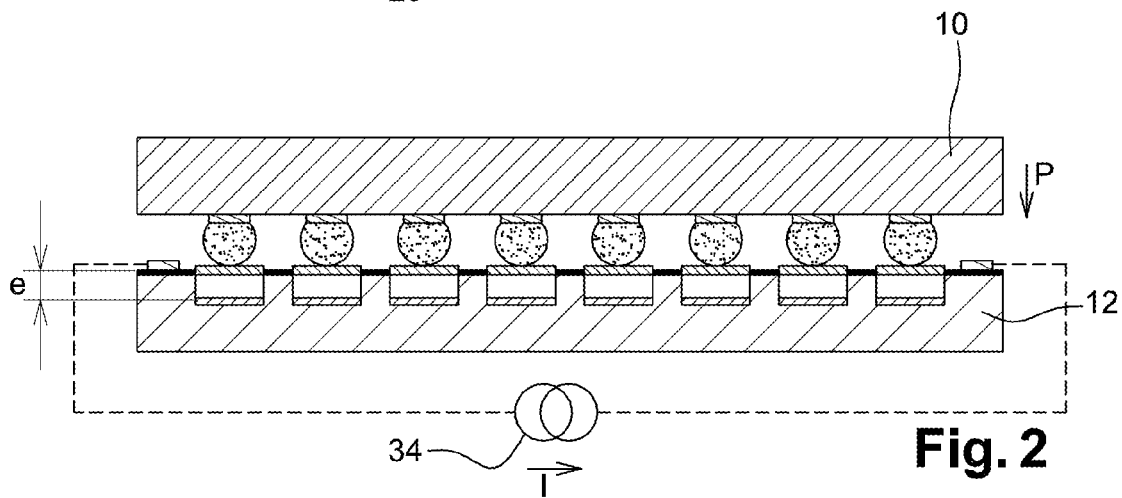
Figure 3:
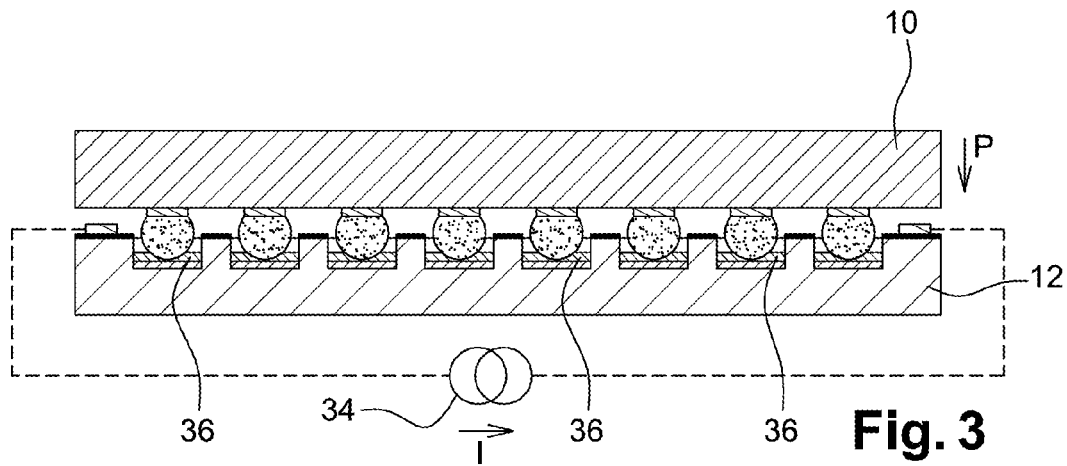
Figure 4:
Figure 5:
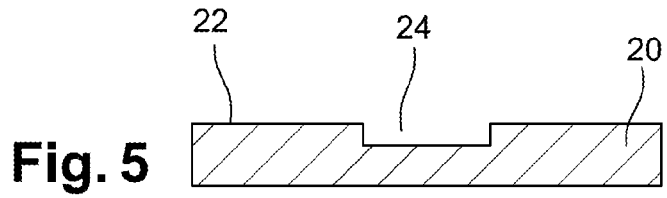

A method of hybridizing a first microelectronic component 10 with a second microelectronic component 12 according to the invention is now described in relation with the simplified cross-section views of FIGS. 1 to 3.

First microcomponent 10, for example, a silicon-based microelectronic chip comprises, on one of its surfaces 14, metal balls 16, for example, soldered to metal areas 18, as known per se in the state of the art.

Second microcomponent 12 comprises a substrate 20, for example, a flexible plastic substrate, particularly made of PET or of PEN, in a surface 22 of which are formed cavities 24 intended to respectively receive balls 14 of first component 10.

A resistive element 26 made of a fusible material, for example, indium, or of an alloy of gold and tin, is further suspended above each cavity 24 and is connected, for example, via metal tracks 28 formed on surface 22 of second component 12, to electric power supply terminals 30, to enable the flowing of an electric current therethrough.

Optionally, the bottom of each cavity 24 further comprises a metal area 32 for the electric connection of ball 14 subsequently introduced into it with, for example, electronic circuits present in substrate 12.

The hybridization method starts by the transfer of first component 10 onto second component 12 by aligning balls 14 with resistive elements 26 (FIG. 1). First component 10 then rests on second component 12 and applies its weight P thereto (FIG. 2).

An electric current I is then applied to each of fusible resistive elements 26, for example, by means of a voltage or current source 34, to said elements them by Joule effect. The molten material then flows into cavities 24. Since it is no longer supported by elements 26 which have been destroyed by melting to form the mechanical and electric contact, first component 10 then settles under the effect of its own weight, and balls 16 are introduced into the cavities along with the molten material 36 (FIG. 3). The method then ends with the cooling of the molten material 36, which solidifies by bonding to the bottom of cavities 24 and to balls 16, so that mechanical and electrical connections are thus formed between components 10, 12.

Thus, during the entire heating period of fusible resistive elements 26, substrate 20 is protected from an excessive heating by the air filling cavities 24 and only comes into contact with the molten material at the last moment, that is, only when fusible elements 26 are destroyed. Further, the cooling of the fusible elements starts immediately after their destruction since this destruction interrupts the current flow, and accordingly the Joule effect heating.

Preferably, height e of cavities 24 is, in the present case, in the range from 2 to 8 micrometers. Generally, height e of the cavities is greater than or equal to ⁄1;8 of the ball height.

A method of manufacturing second component 12 will now be described in relation with FIGS. 4 to 11.

Figure 6:
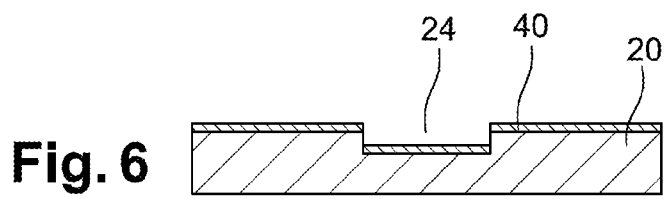

The method starts with the manufacturing of substrate 20, for example, a flexible PET or PEN substrate (cross-section view of FIG. 4) and carries on with the forming of cavities 24 in a surface 22 of substrate 20, for example, by application of an oxygen plasma through a mask (cross-section view of FIG. 6).

Advantageously, the walls of cavity 24 have a slightly inward slope to mechanically block balls 16 after the cooling.

A metal layer 40, for example a gold layer, is then deposited full plate on substrate 20, for example, by evaporation (cross-section view of FIG. 6). Particularly, a metal layer is deposited inside and around of each cavity 24.

Figure 7A:
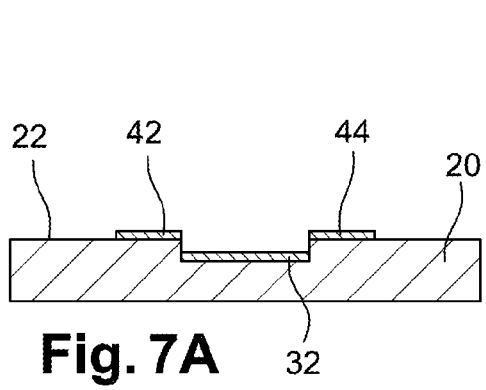
Figure 7B:
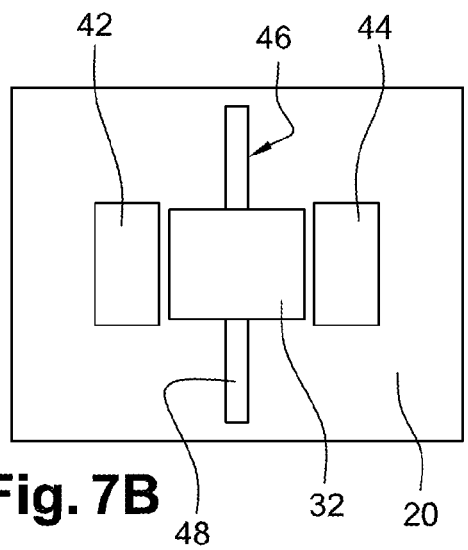

Metal layer 40 is then etched, for example, by means of a photolithography and of a wet or plasma etch step, to define, for each cavity 24, two connection areas 42, 44 on surface 22, electrically insulated from the metal deposited in cavity 24, as well as two connection areas 46, 48 on surface 22, electrically insulated from areas 42, 44 and in contact with metal 32 deposited in cavity 24 (cross-section view of FIG. 7A and top view of FIG. 7B).

Figure 8A:
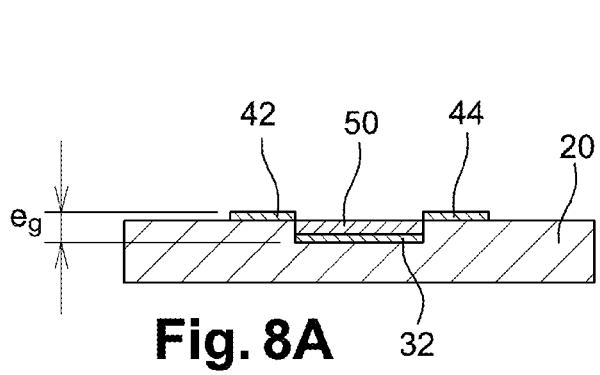
Figure 8B:
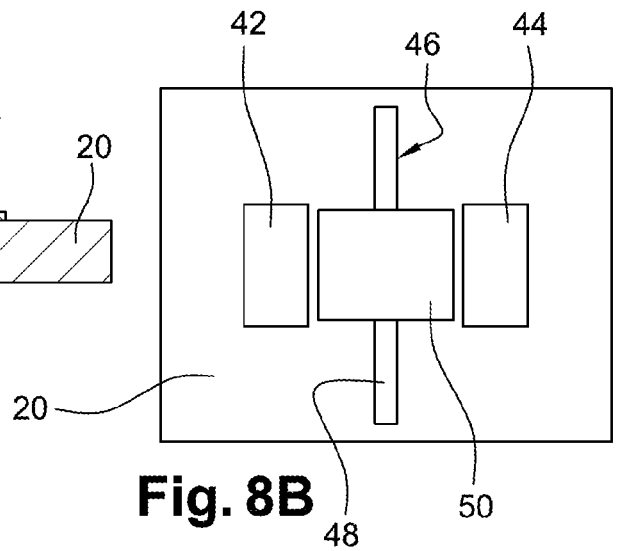

The method then carries on with the deposition of a resin 50 in each cavity 22 to protect metal 32 deposited in cavities 24 and define a solid surface on which fusible resistive elements 26 will be subsequently deposited (cross-section view of FIG. 8A and top view of FIG. 8B). Advantageously, the resin does not totally fill cavities 24 and is slightly recessed with respect to surface 22 of substrate 20 to enable the resistive fusible element to bend downwards as an effect of its weight. Connection areas 42, 44, 46, 48 are then cleaned, for example, by means of an oxygen plasma, of a power in the range from 30 W to 50 W, applied for some ten seconds.

Fusible resistive elements 26 are then formed on resin 50, above each cavity 24, for example, by means of a photolithography depositing fusible metal through a mask of desired shape for elements 26 (cross-section view of FIG. 9A and top view of FIG. 9B). Each resistive element 26 further extends in two metal areas 52, 54 respectively deposited on connection areas 42 and 44. Each element 26 can thus be supplied with current via areas 42, 44.

Advantageously, connection metal areas 42 and 44 have a surface area greater than or equal to twice the surface area of cavities 24 to promote a temperature rise on both sides of the cavity when current is flowing. Such a local temperature rise will induce an expansion of element 12 which will further open cavity 24, which eases the insertion of fusible heating element 26 and of ball 16 into cavity 24 once the current has been applied.

Fusible resistive elements 26 advantageously take the shape of a coil. A coil indeed has a high electric resistance due to its great length and to its small width, and thus a high Joule effect heating, and does not totally cover resin 50 which is thus partially exposed, which enables the subsequent removal of the resin. Other shapes are of course possible for fusible elements 26, such as, for example, parallel rods or strips connected between areas 42, 44. Preferably, the material and the geometrical characteristics of the heating elements are selected so that they melt when they conduct an electric current of a few milliamperes according to the nature of the fusible heating element.

It can be shown that heating $\Delta T$ per second of an element 26 conducting a current of intensity I can be modeled at the first degree according to relation:

$$\Delta T = \frac{\rho \times l^2}{2 \times k_p \times w^2 \times h^2} \times I^2$$

where:
- $\rho$ is the resistivity per meter of the material forming element 26, in $\Omega/m$;
- l is the length in meter of element 26;
- w is the width in meter of element 26;
- h is the height in meter of element 26;
- $k_p$ is the heat conductivity of the material forming element 26, in W/K·m; and
- I is the intensity in ampere of the current flowing through element 26.

Several parameters are thus available, that is, the dimensions of element 26, the nature of the material(s) forming it, as well as the value of the current that it conducts, to control the Joule effect heating of elements 26. It is however possible to select elements 26 which very rapidly melt under the effect of a current in the range from a few milliamperes to a few tens of milliamperes.

The thickness of fusible resistive elements 26 is also selected between 5 micrometers and 15 micrometers to obtain a quantity of molten material in cavities 24 sufficient to attach balls 16. Elements 26 are advantageously made of a metal having a good wettability and bonding, once melted and cooled down, to metal 32 deposited at the bottom of cavities 24, for example, indium or a gold and tin alloy. Advantageously, elements 26 are made of indium, this metal bonding well to metal and having a low melting point equal to 152° C.

The method carries on with the removal of resin 50 filling cavities 26, for example, by wet etching or by means of a plasma, which avoids deteriorating substrate 20 (cross-section view of FIG. 10A and top view of FIG. 10B).

FIG. 11 is a top view of a second component 12 illustrating an example of electric connection for the power supply of an array of N rows of resistive elements 26, for example, three rows, and of M columns of resistive elements, for example, three columns. For clarity, connection areas 46, 48 are not shown.

The electric connection advantageously is a parallel connection of fusible resistive elements 26. For example, the connection comprises, for each column in the array, a first metal track 60, formed on surface 22 of component 12, and connecting each of connection areas 42 of elements 26 of the column to a first common metal track 62 formed on surface 22. Similarly, the connection comprises, for each column in the array, a second metal track 64, formed on surface 22 of component 12, and connecting each of connection areas 44 of elements 26 of the column to a second common metal track 66 formed on surface 22. Common tracks 64, 66 are each connected to an electric power supply terminal 30, so that the application between these terminals of a voltage V enables to circulate a substantially identical electric current in each of elements 26. Of course, other connection diagrams are possible.

A series connection may also be achieved in the case where balls 16 are aligned and laid above fusible heating element 26. Then, a current is applied to the series assembly and all balls are heated at the same time.

It should also be noted that the volume of the fusible heating element can be adaptable to the volume of balls 16. For example, if balls 16 do not all have the same volume, it is possible to take into account the variable volume by increasing or decreasing the volume of the material of fusible heating element 26 to provide a good uniformity of the connections after the cooling of the material.

The invention claimed is:

1. A method of forming a hybridized device comprising forming a first micro-electronic component provided on a surface with metal balls and a second microelectronic component provided on a surface with connection elements corresponding to said metal balls, and hybridizing the first and second components to attach the metal balls of the first component to the connection elements of the second component,
    wherein the manufacturing of the second microelectronic component comprises:
        forming a substrate provided with cavities at the locations provided for the connection elements; and
        forming resistive elements made of fusible metal respectively suspended above the cavities;
    and wherein the hybridization of the first and second components comprises:
        transferring the first component onto the second component to have the metal balls rest on the suspended resistive elements; and
        circulating an electric current through the resistive elements to melt said elements.

2. The method of foil ling a hybridized device of claim 1, wherein the resistive elements are made in the form of coils or of rods.

3. The method of forming a hybridized device of claim 1, wherein the resistive elements are made of a metal of low melting point.

4. The method of forming a hybridized device of claim 1, wherein the substrate of the second microelectronic component comprises plastic.

5. The method of forming a hybridized device of claim 1, wherein the forming of the suspended resistive elements comprises:
    depositing two metal areas around each cavity;
    filling the cavities with resin;
    forming the resistive elements on the resin and on the metal areas, while leaving at least one passage of access to the resin; and
    removing the resin from the cavities through the at least one access passage.

6. The method of forming a hybridized device of claim 5, wherein the metal connection areas have a surface area greater than or equal to twice the surface area of the cavity.

7. The method of forming a hybridized device of claim 1, wherein it comprises, before the forming of the suspended resistive elements, depositing a metal layer at the bottom of each cavity, and at least one electric connection in contact with said layer.

8. The method of forming a hybridized device of claim 1, wherein the height of the cavities is greater than or equal to $\frac{1}{8}$ of the height of the balls.

9. The method of forming a hybridized device of claim 3, wherein the metal of low melting point is indium or a gold and tin alloy.

10. The method of forming a hybridized device of claim 4, wherein the plastic is PEN or PET.

\* \* \* \* \*